(12) United States Patent
Lao (10) Patent No.: US 9,111,998 B2
(45) Date of Patent: Aug. 18, 2015

(54) MULTI-LEVEL STACK HAVING MULTI-LEVEL CONTACT AND METHOD

(75) Inventor: Keith Lao, Austin, TX (US)

(73) Assignees: Samsung Electronics Co., Ltd, Suwon-Si (KR); Samsung Austin Semiconductor L.P., Austin, TX (US)

( * ) Notice: Subject to any disclaimer, the term of this patent is extended or adjusted under 35 U.S.C. 154(b) by 70 days.

(21) Appl. No.: 13/439,087

(22) Filed: Apr. 4, 2012

(65) Prior Publication Data

US 2013/0264717 A1    Oct. 10, 2013

(51) Int. Cl.
*H01L 23/48* (2006.01)
*H01L 23/522* (2006.01)
*H01L 21/768* (2006.01)

(52) U.S. Cl.
CPC ............ *H01L 21/768* (2013.01); *H01L 23/481* (2013.01); *H01L 23/522* (2013.01); *H01L 23/5226* (2013.01)

(58) Field of Classification Search
USPC .......................... 257/E21.585–E21.586, 774; 438/637–640, 668–675
See application file for complete search history.

(56) References Cited

U.S. PATENT DOCUMENTS

| | | | |
|---|---|---|---|
| 6,774,024 B2 | 8/2004 | Miyamoto et al. | |
| 6,972,209 B2 | 12/2005 | Agarwala et al. | |
| 7,473,992 B2 | 1/2009 | Ogawa | |
| 7,557,034 B2 | 7/2009 | Hotta et al. | |
| 7,843,068 B2 | 11/2010 | Murayama et al. | |
| 8,090,983 B2 | 1/2012 | Weiberle et al. | |
| 2003/0160331 A1 | 8/2003 | Fujisawa | |
| 2004/0245643 A1 | 12/2004 | Takewaki et al. | |
| 2010/0109164 A1* | 5/2010 | Kang et al. | 257/774 |
| 2012/0028459 A1* | 2/2012 | Lee et al. | 438/637 |
| 2012/0313114 A1* | 12/2012 | Park et al. | 257/88 |

FOREIGN PATENT DOCUMENTS

| | | |
|---|---|---|
| JP | 2004-335914 | 11/2004 |
| KR | 10-2000-0002910 A | 1/2000 |
| KR | 10-2005-0067507 A | 7/2005 |
| KR | 10-0772254 B1 | 10/2007 |
| WO | WO 01/42979 A1 | 6/2001 |

* cited by examiner

*Primary Examiner* — Fernando L Toledo
*Assistant Examiner* — Lawrence-Linh T Nguyen (57) ABSTRACT

A method for forming a multi-level stack having a multi-level contact is provided. The method includes forming a multi-level stack comprising a specified number, n, of conductive layers and at least n−1 insulating layers. A via formation layer is formed over the stack. A first via is etched in the via formation layer at a first edge of the stack. A first multi-level contact is formed in the first via. For a particular embodiment, a second via may be etched in the via formation layer at a second edge of the stack and a second multi-level contact may be formed in the second via.

17 Claims, 6 Drawing Sheets

MULTI-LEVEL STACK HAVING MULTI-LEVEL CONTACT AND METHOD

TECHNICAL FIELD OF THE INVENTION

The present application relates generally to integrated circuit fabrication and, more specifically, to a multi-level stack having at least one multi-level contact.

BACKGROUND OF THE INVENTION

The fabrication of integrated circuits generally involves the use of a number of masking steps for patterning and etching different parts of components for the integrated circuits. Each masking step is relatively expensive. Thus, for integrated circuits requiring a large number of masking steps, the process for fabricating those integrated circuits can be very expensive.

For conventional integrated circuits including multi-level metal stacks, the fabrication process generally provides for forming a metal line, forming an insulating layer, etching vias in the insulating layer, filling the vias to form contacts, and forming a next metal line. The process is repeated until the desired number of metal lines is formed. Thus, contacts are formed from the top of each metal line to the bottom of a subsequently formed metal line. This process requires a relatively large number of masking steps for metal stacks having more than just a few metal lines, making the process relatively expensive to implement.

SUMMARY OF THE INVENTION

A multi-level stack having a multi-level contact and method is provided.

For one embodiment, a method for forming a multi-level stack having a multi-level contact is provided that includes forming a multi-level stack comprising a specified number, n, of conductive layers and at least n−1 insulating layers. A via formation layer is formed over the stack. A first via is etched in the via formation layer at a first edge of the stack. A first multi-level contact is formed in the first via.

For another embodiment, a method for forming a multi-level stack having a multi-level contact is provided that includes forming a first conductive layer. A first insulating layer is formed over the first conductive layer. A second conductive layer is formed over the first insulating layer without forming contacts in the first insulating layer. A via formation layer is formed over the second conductive layer. A first via is etched into the via formation layer at a first edge of the first conductive layer and the second conductive layer. A first multi-level contact is formed in the first via.

For yet another embodiment, a multi-level stack is provided that includes a specified number, n, of conductive layers, at least n−1 insulating layers, and a first multi-level contact. The first multi-level contact is located at a first edge of the stack.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device or system.

FIGS. 1A-E are a series of schematic cross-sectional diagrams illustrating a process for forming a multi-level stack having a multi-level contact in accordance with one embodiment of the present disclosure.

Figure 1A:
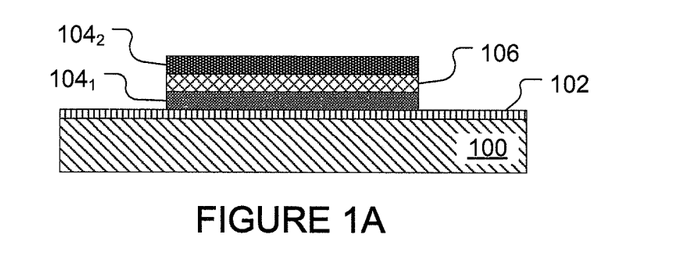
FIGS. 1A-E are a series of schematic cross-sectional diagrams illustrating a process for forming a multi-level stack having a multi-level contact in accordance with one embodiment of the present disclosure.

Referring to FIG. 1A, an initial structure is provided that includes a substrate 100, a buffer layer 102, a first conductive layer $104_1$, an insulating layer 106, and a second conductive layer $104_2$. The buffer layer 102 is formed over the substrate 100 to provide a buffer between the first conductive layer $104_1$ and the substrate 100. The buffer layer 102 may be formed by any suitable technique. The buffer layer 102 may comprise any suitable insulating material. It will be understood that any suitable additional layers may be formed other than those illustrated in FIGS. 1A-E, such as another layer between the buffer layer 102 and the first conductive layer $104_1$, for example.

The first conductive layer $104_1$ is formed over the buffer layer 102 by any suitable technique. The first conductive layer $104_1$ may comprise any suitable conductive material. The first conductive layer $104_1$ is also patterned and etched to provide any suitable number of stacks. Thus, although the illustrated example includes a single stack, it will be understood that any suitable number of additional stacks may be formed simultaneously in the same manner at other locations above the substrate 100 and the buffer layer 102 that are not shown in FIGS. 1A-E.

The insulating layer 106 is formed over the first conductive layer $104_1$ by any suitable technique. The first insulating layer 106 may comprise any suitable insulating material. The insulating layer 106 is also patterned and etched as shown in FIG. 1A.

The second conductive layer $104_2$ is formed over the insulating layer 106 by any suitable technique. The second conductive layer $104_2$ may comprise any suitable conductive material. The second conductive layer $104_2$ is also patterned and etched.

The illustrated example includes two conductive layers 104. However, as described with reference to FIG. 3 below, any suitable number of conductive layers 104 may be included. As shown in FIG. 1A, the conductive layers 104 and the insulating layer 106 are each formed without patterning, etching and filling vias between the conductive layers 104.

Figure 1B:
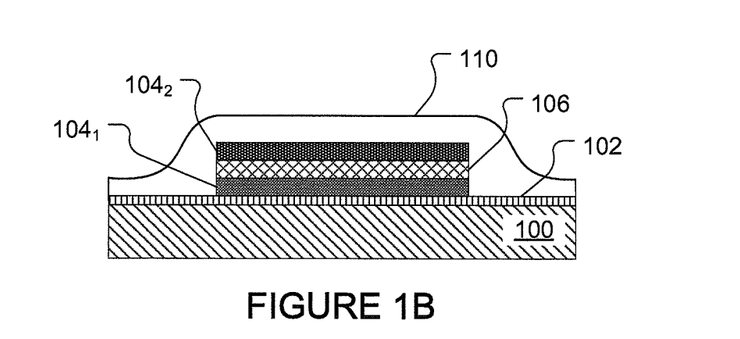

Referring to FIG. 1B, a via formation layer 110 is formed over the stack of the conductive layers 104 and the insulating layer 106. Thus, the via formation layer 110 is formed after the stack is formed. The via formation layer 110 may be formed by any suitable technique. The via formation layer 110 may comprise any suitable material.

Figure 1C:
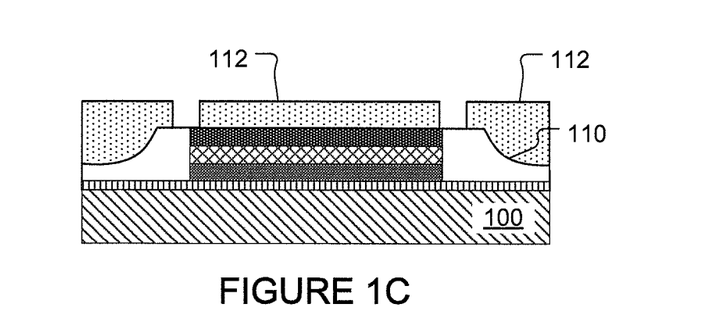

Referring to FIG. 1C, the via formation layer 110 is planarized and a photoresist layer 112 is formed over the via formation layer 110 and the second conductive layer $104_2$. The photoresist layer 112 is patterned and etched to expose the via formation layer 110 where vias are to be formed.

As shown in FIG. 1C, the patterning of the photoresist layer 112 may be slightly misaligned without affecting the performance of the resulting stack. Thus, the opening in the photoresist layer 112 on the right side of the stack is slightly misaligned and the opening on the left side is a little more misaligned to illustrate the self-aligning property of the multi-level contacts to be formed.

Figure 1D:
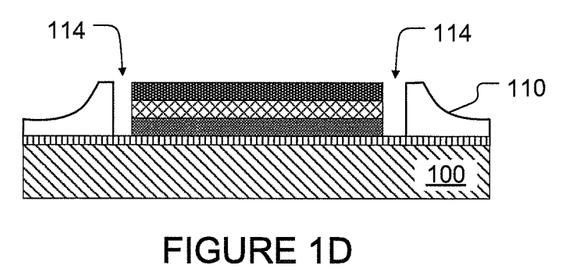

Referring to FIG. 1D, a via 114 is etched into the via formation layer 110 in accordance with the pattern of the photoresist layer 112, and the photoresist layer 112 is removed. Thus, a via 114 is formed on each edge of the stack. The vias 114 may be etched using any suitable etching technique that is selective to the material of the buffer layer 102.

Figure 1E:
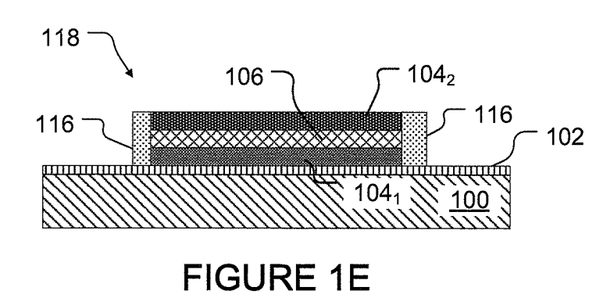

Referring to FIG. 1E, the vias 114 are filled to form multi-level contacts 116. The vias 114 may be filled using copper or any other suitable conductive material. The via formation layer 110 is then removed, resulting in the formation of a multi-level stack 118 having a multi-level contact 116 at each edge of the stack 118. Thus, instead of forming a contact between the conductive layers 104, a multi-level contact 116 is formed at an edge of the conductive layers 104. As shown below in FIG. 3, a single via 114 for forming a multi-level contact 116 may be used for more than two conductive layers 104, thereby eliminating masking steps for via and contact formation for each of the additional conductive layers 104.

Although the embodiment illustrated in FIGS. 1A-E provides for two multi-level contacts 116, with one contact 116 on each edge of the stack 118, it will be understood that the same method described above may be used to form a multi-level stack having a single multi-level contact on one edge of the stack but not the other edge of the stack.

FIGS. 2A-E are a series of schematic cross-sectional diagrams illustrating a process for forming a multi-level stack having a multi-level contact in accordance with an alternative embodiment of the present disclosure.

Figure 2A:
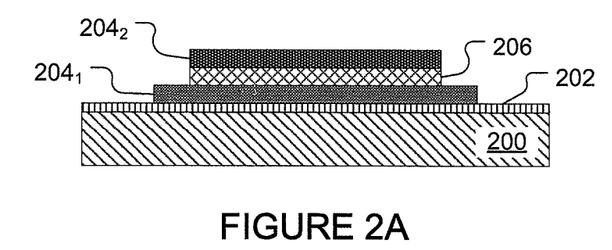
FIGS. 2A-E are a series of schematic cross-sectional diagrams illustrating a process for forming a multi-level stack having a multi-level contact in accordance with an alternative embodiment of the present disclosure.

Referring to FIG. 2A, an initial structure is provided that includes a substrate 200, a buffer layer 202, a first conductive layer $204_1$, an insulating layer 206, and a second conductive layer $204_2$. The buffer layer 202 is formed over the substrate 200 to provide a buffer between the first conductive layer $204_1$ and the substrate 200. The buffer layer 202 may be formed by any suitable technique. The buffer layer 202 may comprise any suitable insulating material. It will be understood that any suitable additional layers may be formed other than those illustrated in FIGS. 2A-E, such as another layer between the buffer layer 202 and the first conductive layer $204_1$, for example.

The first conductive layer $204_1$ is formed over the buffer layer 202 by any suitable technique. The first conductive layer $204_1$ may comprise any suitable conductive material. The first conductive layer $204_1$ is also patterned and etched to provide any suitable number of stacks. Thus, although the illustrated example includes a single stack, it will be understood that any suitable number of additional stacks may be formed simultaneously in the same manner at other locations above the substrate 200 and the buffer layer 202 that are not shown in FIGS. 2A-E.

The insulating layer 206 is formed over the first conductive layer $204_1$ by any suitable technique. The first insulating layer 206 may comprise any suitable insulating material. The insulating layer 206 is also patterned and etched as shown in FIG. 2A. The insulating layer 206 does not substantially cover the first conductive layer $204_1$ (as compared to the stack 118 illustrated in FIGS. 1A-E) but instead leaves an outer portion of the first conductive layer $204_1$ exposed.

The second conductive layer $204_2$ is formed over the insulating layer 206 by any suitable technique. The second conductive layer $204_2$ may comprise any suitable conductive material. The second conductive layer $204_2$ is also patterned and etched.

The illustrated example includes two conductive layers 204. However, as described with reference to FIG. 4 below, any suitable number of conductive layers 204 may be included. As shown in FIG. 2A, the conductive layers 204 and the insulating layer 206 are each formed without patterning, etching and filling vias between the conductive layers 204.

Figure 2B:
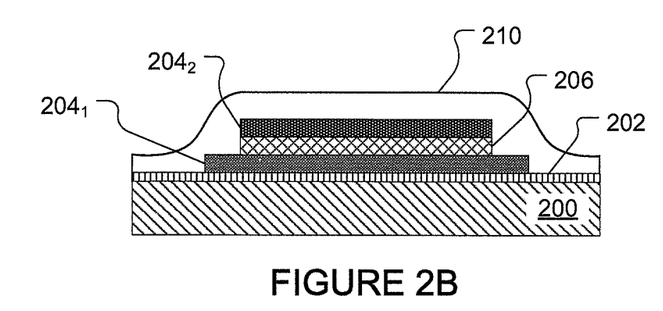

Referring to FIG. 2B, a via formation layer 210 is formed over the stack of the conductive layers 204 and the insulating layer 206. Thus, the via formation layer 210 is formed after the stack is formed. The via formation layer 210 may be formed by any suitable technique. The via formation layer 210 may comprise any suitable material.

Figure 2C:
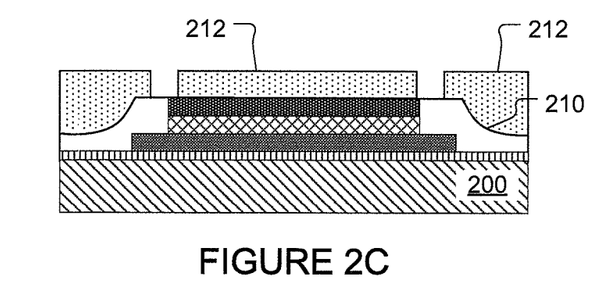

Referring to FIG. 2C, the via formation layer 210 is planarized and a photoresist layer 212 is formed over the via formation layer 210 and the second conductive layer $204_2$. The photoresist layer 212 is patterned and etched to expose the via formation layer 210 where vias are to be formed.

As shown in FIG. 2C, the patterning of the photoresist layer 212 may be slightly misaligned without affecting the performance of the resulting stack. Thus, the opening in the photoresist layer 212 on the right side of the stack is slightly misaligned and the opening on the left side is a little more misaligned to illustrate the self-aligning property of the multi-level contacts to be formed.

Figure 2D:
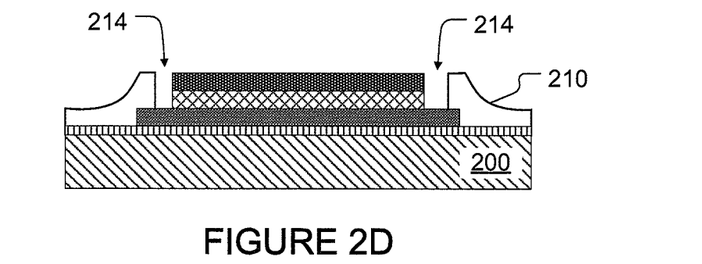

Referring to FIG. 2D, a via 214 is etched into the via formation layer 210 in accordance with the pattern of the photoresist layer 212, and the photoresist layer 212 is removed. Thus, a via 214 is formed on each edge of the stack. The vias 214 may be etched using any suitable etching technique that is selective to the material of the first conductive layer 204₁. Thus, instead of using the buffer layer 202 as a stop (similar to the embodiment of FIGS. 1A-E), the first conductive layer 204₁ is used as a stop.

Figure 2E:
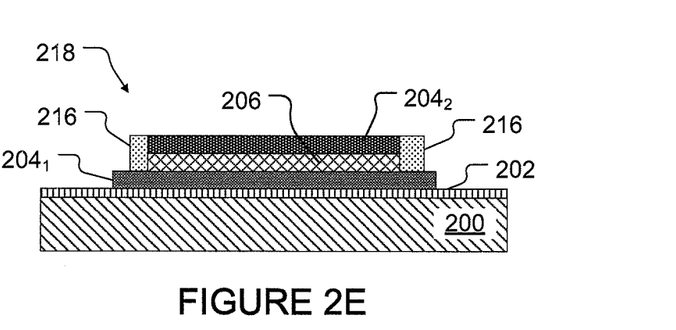

Referring to FIG. 2E, the vias 214 are filled to form multi-level contacts 216. The vias 214 may be filled using copper or any other suitable conductive material. The via formation layer 210 is then removed, resulting in the formation of a multi-level stack 218 having a multi-level contact 216 at each edge of the stack 218. Thus, instead of forming a contact between the conductive layers 204, a multi-level contact 216 is formed at an edge of the conductive layers 204. As shown below in FIG. 4, a single via 214 for forming a multi-level contact 216 may be used for more than two conductive layers 204, thereby eliminating masking steps for via and contact formation for each of the additional conductive layers 204.

Although the embodiment illustrated in FIGS. 2A-E provides for two multi-level contacts 216, with one contact 216 on each edge of the stack 218, it will be understood that the same method described above may be used to form a multi-level stack having a single multi-level contact on one edge of the stack but not the other edge of the stack.

Figure 3:
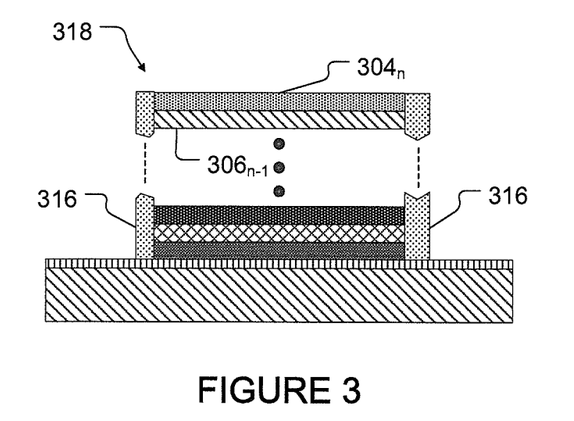
FIG. 3 illustrates a multi-level stack similar to the multi-level stack of FIG. 1E in accordance with another embodiment of the present disclosure.

FIG. 3 illustrates a multi-level stack 318 similar to the multi-level stack 118 in accordance with another embodiment of the present disclosure. As described above, a multi-level stack 318 having any suitable number of conductive layers 304 may be formed in the same manner as described with respect to FIGS. 1A-E. Thus, as shown in FIG. 3, the stack 318 comprises n conductive layers 304 and n−1 insulating layers 306. However, a single multi-level contact 316 is still used to provide a contact to each of the conductive layers 304. Depending on the particular application in which the multi-level stack 318 is to be implemented, the value of n may be 8, 10 or any other suitable number that allows the vias to be properly filled. In addition, it will be understood that a multi-level stack similar to the stack 318 illustrated in FIG. 3 may be formed with a single multi-level contact on one edge of the stack but not the other edge of the stack.

Figure 4:
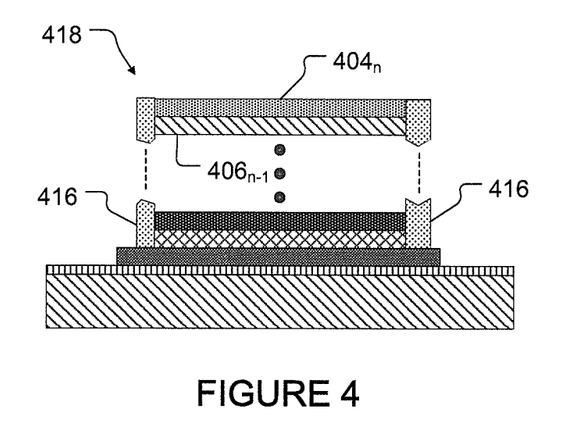
FIG. 4 illustrates a multi-level stack similar to the multi-level stack of FIG. 2E in accordance with another embodiment of the present disclosure.

FIG. 4 illustrates a multi-level stack 418 similar to the multi-level stack 218 in accordance with another embodiment of the present disclosure. As described above, a multi-level stack 418 having any suitable number of conductive layers 404 may be formed in the same manner as described with respect to FIGS. 2A-E. Thus, as shown in FIG. 4, the stack 418 comprises n conductive layers 404 and n−1 insulating layers 406. However, a single multi-level contact 416 is still used to provide a contact to each of the conductive layers 404. Depending on the particular application in which the multi-level stack 418 is to be implemented, the value of n may be 8, 10 or any other suitable number that allows the vias to be properly filled. In addition, it will be understood that a multi-level stack similar to the stack 418 illustrated in FIG. 4 may be formed with a single multi-level contact on one edge of the stack but not the other edge of the stack.

Figure 5:
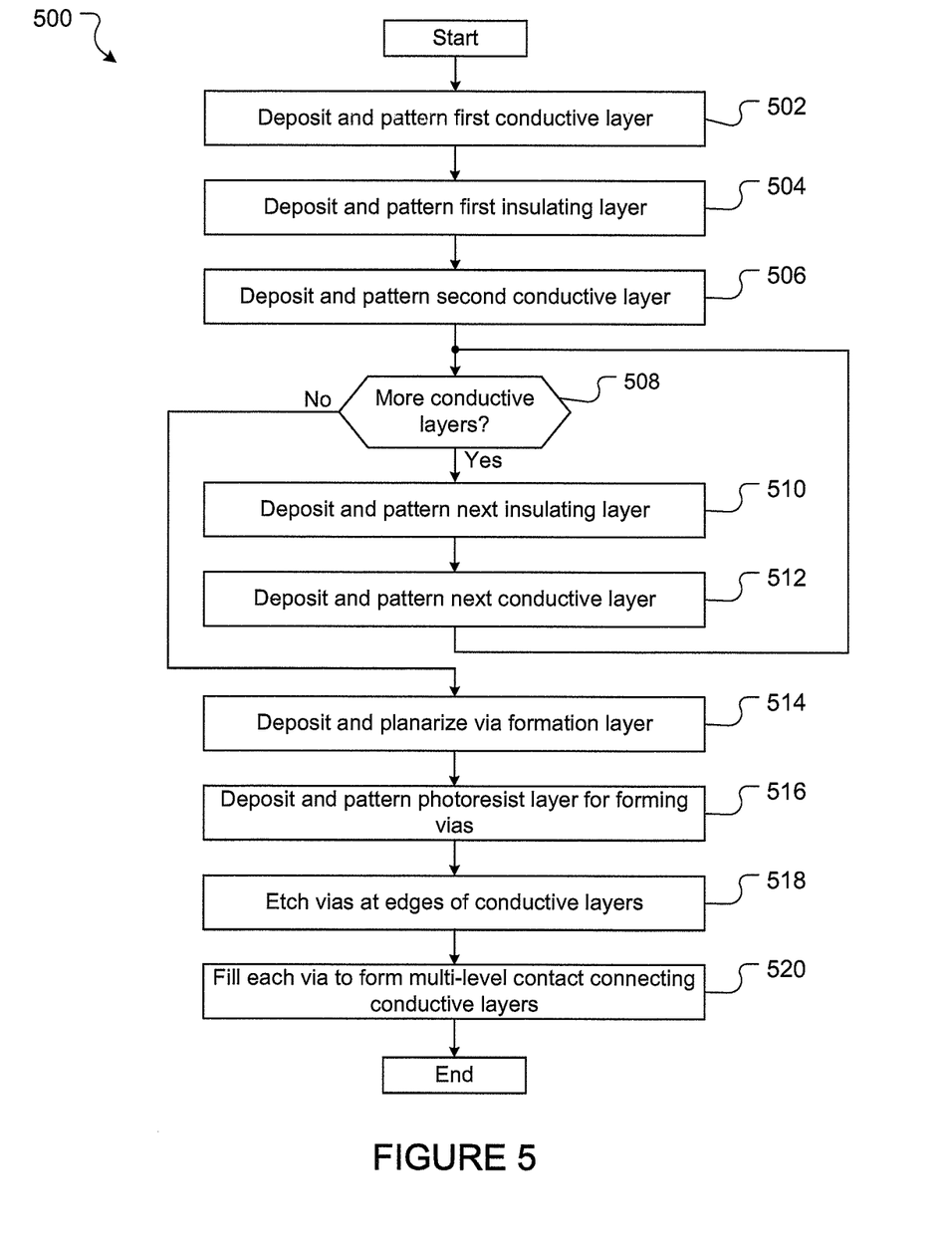
FIG. 5 is a flowchart illustrating a method for fabricating the multi-level stack of FIG. 1E, 2E, 3 or 4 in accordance with the present disclosure.

FIG. 5 is a flowchart illustrating a method 500 for fabricating the multi-level stack 118, 218, 318 or 418 in accordance with the present disclosure. The method 500 shown in FIG. 5 is for illustration only. The multi-level stack 118, 218, 318 or 418 may be fabricated in any other suitable manner without departing from the scope of this disclosure. For simplicity, the following description refers to the multi-level stack 118 of FIG. 1 with the possibility of additional layers. However, it will be understood that the method 500 may be used to fabricate any of the stacks 218, 318 or 418 described above.

Initially, a first conductive layer 104₁ is deposited and patterned (step 502). A first insulating layer 106₁ is deposited over the first conductive layer 104₁ and patterned (step 504). A second conductive layer 104₂ is deposited over the first insulting layer 106₁ and patterned without forming contacts in the first insulating layer 106₁ (step 506).

If the stack 118 is to include more conductive layers 104 (step 508), a next insulating layer 106 is deposited and patterned (step 510) and a next conductive layer 104 is deposited and patterned without forming contacts in the next insulating layer 106 (step 512). Additional insulating layers 106 and conductive layers 104 are deposited and patterned (steps 510 and 512) until no more conductive layers 104 are to be included in the stack 118 (step 508).

When no more conductive layers 104 are to be included in the stack 118 (step 508), a via formation layer 110 is deposited over the final conductive layer 104ₙ and planarized (step 514). A photoresist layer 112 is deposited over the via formation layer 110 and patterned for forming vias 114 (step 516). Vias 114 are etched at the edges of the conductive layers 104 (step 518). Each via 114 is filled to form a multi-level contact 116 that connects the conductive layers 104 in the stack 118 to each other (step 520).

In this way, a single processing step may be used to form a single multi-level contact 116 connecting the conductive layers 104 instead of using multiple processing steps to form multiple contacts that each connect one conductive layer 104 to only one other conductive layer 104. As a result, the expense of forming the multi-level stack 118 is greatly reduced and the turn-around-time is also reduced. In addition, the contacts 116 are self-aligned. Thus, alignment does not have to be as precise and critical dimension is less important.

Modifications, additions, or omissions may be made to the systems, apparatuses, and methods described herein without departing from the scope of the disclosure. For example, the components of the systems and apparatuses may be integrated or separated. Moreover, the operations of the systems and apparatuses may be performed by more, fewer, or other components. The methods may include more, fewer, or other steps. Additionally, as described above, steps may be performed in any suitable order. Furthermore, using the same method, a photoresist layer may be patterned for forming a single via in step 516, the single via may be etched in step 518, and the single via may be filled to form a single multi-level contact in step 520.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for forming a multi-level stack having a multi-level contact, comprising:
    forming a multi-level stack comprising a specified number, n, of conductive layers and at least n−1 insulating layers, the stack having a plurality of outside edges;
    forming a via formation layer over the stack;
    etching a first via in the via formation layer at a first outside edge of the stack;
    etching a second via in the via formation layer at a second outside edge of the stack;
    forming a first multi-level contact in the first via; and
    forming a second multi-level contact in the second via.

2. The method of claim 1, wherein the first multi-level contact is configured to connect the conductive layers to each other on the first outside edge of the stack and the second multi-level contact is configured to connect the conductive layers to each other on the second outside edge of the stack.

3. The method of claim 1, wherein:
    the conductive layers comprise a lower conductive layer and upper conductive layers, the first multi-level contact is configured to connect a first region of a top surface of the lower conductive layer to edges of the upper conductive layers on the first outside edge of the stack, and the second multi-level contact is configured to connect a second region of the top surface of the lower conductive layer to edges of the upper conductive layers on the second outside edge of the stack.

4. The method of claim 1, wherein the first multi-level contact is configured to connect the conductive layers to each other on the first outside edge of the stack.

5. The method of claim 1, wherein:

the conductive layers comprise a lower conductive layer and upper conductive layers, and the first multi-level contact is configured to connect a first region of a top surface of the lower conductive layer to edges of the upper conductive layers on the first outside edge of the stack.

6. The method of claim 1, wherein forming the via formation layer comprises depositing the via formation layer and planarizing the via formation layer, the method further comprising:

depositing a photoresist layer over the planarized via formation layer; and patterning the photoresist layer to expose the via formation layer at the first outside edge of the stack.

7. A method for forming a multi-level stack having a multi-level contact, comprising:

forming a first conductive layer;

forming a first insulating layer over the first conductive layer;

forming a second conductive layer over the first insulating layer without forming contacts in the first insulating layer;

forming a via formation layer over the second conductive layer;

etching a first via into the via formation layer at a first outside edge of the first conductive layer and the second conductive layer;

etching a second via into the via formation layer at a second outside edge of the first conductive layer and the second conductive layer;

forming a first multi-level contact in the first via: and forming a second multi-level contact in the second via.

8. The method of claim 7, wherein the first multi-level contact is configured to connect the first and second conductive layers to each other on the first outside edge and the second multi-level contact is configured to connect the first and second conductive layers to each other on the second outside edge.

9. The method of claim 7, wherein:

the first multi-level contact is configured to connect a first region of a top surface of the first conductive layer to the second conductive layer on the first outside edge, and the second multi-level contact is configured to connect a second region of the top surface of the first conductive layer to the second conductive layer on the second outside edge.

10. The method of claim 7, wherein the first multi-level contact is configured to connect the first and second conductive layers to each other on the first outside edge.

11. The method of claim 7, wherein the first multi-level contact is configured to connect a first region of a top surface of the first conductive layer to the second conductive layer on the first outside edge.

12. The method of claim 7, further comprising forming additional alternating insulating layers and conductive layers, wherein forming the via formation layer comprises forming the via formation layer over the additional insulating layers and conductive layers.

13. A multi-level stack, comprising:

a specified number, n, of conductive layers;

at least n−1 insulating layers;

a first multi-level contact formed at a first outside edge of the stack; and a second multi-level contact at a second outside edge of the stack.

14. The multi-level stack of claim 13, wherein the first multi-level contact is configured to connect the conductive layers to each other on the first outside edge of the stack and the second multi-level contact is configured to connect the conductive layers to each other on the second outside edge of the stack.

15. The multi-level stack of claim 13, wherein:

the conductive layers comprise a lower conductive layer and upper conductive layers, the first multi-level contact is configured to connect a first region of a top surface of the lower conductive layer to edges of the upper conductive layers on the first outside edge of the stack, and the second multi-level contact is configured to connect a second region of the top surface of the lower conductive layer to edges of the upper conductive layers on the second outside edge of the stack.

16. The multi-level stack of claim 13, wherein the multi-level stack is formed over a buffer layer that is deposited over a substrate.

17. A multi-level stack, comprising:

a specified number, n, of conductive layers;

at least n−1 insulating layers; and a first multi-level contact formed at a first outside edge of the stack, wherein the insulating layers are formed between the conductive layers, and wherein the insulating layers are formed without providing contacts between the conductive layers.

* * * * *